United States Patent
Kikuchi et al.

(10) Patent No.: US 8,389,975 B2
(45) Date of Patent: Mar. 5, 2013

(54) GROUP III NITRIDE SEMICONDUCTOR LIGHT-EMITTING DEVICE

(75) Inventors: Tomo Kikuchi, Chichibu (JP); Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 184 days.

(21) Appl. No.: 12/680,705

(22) PCT Filed: Aug. 28, 2008

(86) PCT No.: PCT/JP2008/065914
§ 371 (c)(1),
(2), (4) Date: May 21, 2010

(87) PCT Pub. No.: WO2009/041237
PCT Pub. Date: Apr. 2, 2009

(65) Prior Publication Data
US 2010/0288998 A1 Nov. 18, 2010

(30) Foreign Application Priority Data
Sep. 27, 2007 (JP) .................................. 2007-251167

(51) Int. Cl.
*H01L 33/04* (2010.01)
(52) U.S. Cl. ........................................................ 257/13
(58) Field of Classification Search ............ 257/79–103, 257/13, 70, 918, E51.018–E51.022, 14; 438/22–47, 438/69, 493, 503, 507, 956
See application file for complete search history.

(56) References Cited

U.S. PATENT DOCUMENTS

| | | | |
|---|---|---|---|
| 6,608,330 B1 * | 8/2003 | Yamada | 257/90 |
| 7,612,363 B2 | 11/2009 | Takeda et al. | |
| 2004/0056258 A1 | 3/2004 | Tadatomo et al. | |
| 2006/0049415 A1 * | 3/2006 | Liao et al. | 257/94 |
| 2006/0097283 A1 | 5/2006 | Taki | |
| 2008/0093621 A1 | 4/2008 | Takeda et al. | |

FOREIGN PATENT DOCUMENTS

| | | |
|---|---|---|
| EP | 0936682 A1 | 8/1999 |
| JP | 553834 B2 | 1/1980 |
| JP | 06053549 A | 2/1994 |

(Continued)

OTHER PUBLICATIONS

Translation of Japanese document JP 2001-156328, Inventor: Kukuchi et al. Published the invention on Jun. 2001.*

(Continued)

*Primary Examiner* — Dao H Nguyen
*Assistant Examiner* — Tram H Nguyen
(74) *Attorney, Agent, or Firm* — Sughrue Mion, PLLC

(57) ABSTRACT

A Group III nitride semiconductor light-emitting device comprises a substrate (1) and a light-emitting layer (5) having the multiple quantum well structure that comprises barrier layers (5a) and well layers (5b) formed of a gallium-containing Group III nitride semiconductor material provided on the substrate. Each of the well layers constituting the multiple quantum well structure is made of a Group III nitride semiconductor layer to which acceptor impurities are added, and which has thicknesses different from one another and the same conductivity type as that of the barrier layer. The present invention can provide a Group III nitride semiconductor white light-emitting device which can enhance luminous intensity, can obtain high color rendering properties has a simple structure that can be easily formed without fine adjustment of a composition of a phosphor.

4 Claims, 7 Drawing Sheets

FOREIGN PATENT DOCUMENTS

| | | |
|---|---|---|
| JP | 06314824 A | 11/1994 |
| JP | 07007223 A | 1/1995 |
| JP | 07015044 A | 1/1995 |
| JP | 07018357 A | 1/1995 |
| JP | 07099345 A | 4/1995 |
| JP | 07235624 A | 9/1995 |
| JP | 07283438 A | 10/1995 |
| JP | 07288341 A | 10/1995 |
| JP | 07335942 A | 12/1995 |
| JP | 10-022525 A | 1/1998 |
| JP | 10093146 B2 | 4/1998 |
| JP | 10242513 B2 | 9/1998 |
| JP | 2000208815 B2 | 7/2000 |
| JP | 2001-028458 A | 1/2001 |
| JP | 2001060719 A | 3/2001 |
| JP | 2001-156328 A | 6/2001 |
| JP | 2001257379 A | 9/2001 |
| JP | 3503139 B2 | 12/2003 |
| JP | 2004158873 B2 | 6/2004 |
| JP | 2004363635 B2 | 12/2004 |
| JP | 2005-93578 A | 4/2005 |
| JP | 2006-074010 A | 3/2006 |
| JP | 2006-80525 A | 3/2006 |
| JP | 2006-114886 A | 4/2006 |
| JP | 2007-184346 A | 7/2007 |
| TW | 200514283 A | 4/2005 |
| TW | 200618353 A | 6/2006 |
| TW | 200623462 A | 7/2006 |
| WO | 02/49121 A1 | 6/2002 |

OTHER PUBLICATIONS

Fumio Hasegawa et al., Wide-gap Semiconductor Optical/Electric Device, Morikita Publishing Co., Ltd, pp. 173-175.

* cited by examiner

GROUP III NITRIDE SEMICONDUCTOR LIGHT-EMITTING DEVICE

CROSS REFERENCE TO RELATED APPLICATIONS

This application is a National Stage of International Application No. PCT/JP2008/065914 filed Aug. 28, 2008, claiming priority based on Japanese Patent Application No. 2007-251167 filed Sept. 27, 2007, the contents of all of which are incorporated herein by reference in their entirety.

TECHNICAL FIELD

The present invention relates to a Group III nitride semiconductor light-emitting device comprising a substrate and a light-emitting layer having the multiple quantum well structure that comprises barrier layers and well layers formed of a gallium-containing Group III nitride semiconductor material provided on the surface of the substrate.

BACKGROUND ART

A Group III nitride semiconductor material such as gallium indium nitride (GaInN) has been conventionally used for a light-emitting layer of a short-wavelength light-emitting diode (abbr.: LED) of, for example, white or blue or a laser diode (abbr.: LD) (see, for example, JP-B No. 55-3834). Aluminum gallium nitride (AlGaN) has been used as a material for a light-emitting layer of a near-ultra violet LED or an ultra violet LED (see, for example, JP-A No. 2001-60719).

One type of the conventional white LEDs comprises chip or lamp shaped red, green, and blue LEDs respectively emitting color lights of red (R), green (G), and blue (B), which are light's three primary colors. The numbers of red, green, and blue LEDs used respectively correspond to the relative emission intensity ratios. The LEDs are integrated and arranged on the same substrate, and, as a whole, the mixture of red, blue, and green provides emission of white light (see, for example, JP-A Nos. 6-314824, 7-7223, 7-15044, 7-235624, 7-288341, 7-283438, and 7-335942). This type of white LED may be referred to as an array-type (module) white LED.

Another type of conventional white LED includes light-emitting layers which are separately provided on one substrate, each emit red, green, and blue lights, and are made of, for example, a Group III nitride semiconductor (see, for example, JP-A Nos. 6-53549 and 7-183576). The white LED may be referred to as an RGB-type white LED which emits white color by mixing lights corresponding to the light's three primary colors (red (R), green (G), and blue (B)) emitted from respective light-emitting layers.

Still another type of conventional white LED is a white LED having light-emitting layers which respectively emit light in a relation of complementary colors and are provided on a single substrate. For example, in the white LED, a Group III nitride semiconductor light-emitting layer emitting blue light and a light-emitting layer emitting yellow light are respectively provided on the same substrate, and two lights which are emitted from the respective light-emitting layers different in color (for example, blue and yellow) and wavelength are mixed to emit white color (see, for example, JP-A No. 2001-257379). The white LED may be referred to as a complementary color type white LED utilizing the fact that when two lights of different colors (different wavelengths) in a complementary relationship are mixed, the mixture is visually perceived as a white light.

In addition to the above three types of LED, there is an LED which utilizes light emitted from a Group III nitride semiconductor light-emitting layer to excite a phosphor emitting fluorescence with a wavelength different from the light emitted from the light-emitting layer, and, thus, to convert the wavelength of the emitted light (see, for example, JP-A No. 7-99345). For example, the LED may be referred to as a fluorescent-type white LED which utilizes blue light or ultra violet light emitted from a Group III nitride semiconductor light-emitting layer to excite a phosphor, and, thus, to emit white light (see, for example, Japanese Patent Nos. 2900928, 3724490 and 3724498). As the phosphor excited by blue light or ultra violet light to provide white light, yttrium aluminum garnet ($Y_3Al_5O_{12}$) and the like are used (see, for example, Japanese Patent Nos. 2927279, 3503139 and 3700502).

However, in the array-type white LED, for example, a plane area of the light-emitting layers respectively emitting red, green, or blue light is much smaller than the installation plane area required for integration and arrangement of the chip or lamp shaped red, green, or blue LEDs (see JP-A Nos. 6-314824 and 7-15044 to 7-335942).

That is, since the plane area occupied by the light-emitting layers providing light emission is extremely smaller than the plane area required for installation of the lamps, it is disadvantageous in obtaining a light-emitting device with high luminous intensity (lumen/area).

For example, when a substantially square LED chip with a side of 0.3 mm is surrounded by a resin and has a shell-shaped vertical cross section and a circular horizontal cross section to form a lamp of a typical shape, the outer diameter (the diameter) of the lamp is generally 3 to 5 mm (see paragraph (0007) of JP-A No. 6-314824). Thus, for example, in a lamp with an outer diameter of 5 mm, even when a light-emitting layer exists on the entire plane surface of a chip, the plane area is 0.09 $mm^2$, which is much smaller than the plane area of the lamp (about 20 $mm^2$). Thus, it is never advantageous in obtaining a light-emitting element with higher luminous intensity.

In the RGB-type white LED, the light-emitting layers which can respectively emit red (R), green (B), and blue (B) light are required to be separately provided. In addition to the requirement of providing a plurality of light-emitting layers, a clad layer or the like accompanying the light-emitting layer are required to be provided for each of the light-emitting layers in order to confine carriers (electrons and electron holes) in the light-emitting layer and confine light emission caused by radiative recombination of the carriers. Thus, a plurality of light-emitting layers are required to be provided on a single substrate, and, more preferably, the light-emitting layers and the clad layers or the like hetero-junctioned with the respective light-emitting layers are required to be provided. Thus, the process for forming the RGB-type white LED is complex and redundant. In this case, p-type and n-type electrodes are required to be provided for each light-emitting layer emitting different color light. Since the electrodes need to be provided in the clad layer of the conductivity type corresponding to each of the electrodes and the like, the light-emitting layer is scraped and removed, leading to deterioration of the luminous intensity of each emission.

Also in the complementary color type white LED, two or more light-emitting layers are required to be provided in order to emit lights of colors in a complementary relationship. In order to obtain light emission with higher luminous intensity, like the case of the RGB-type white LED, clad layers of the light-emitting layers are required to be joined to form a light-emitting part having a single hetero—(abbr.: SH) or double hetero—(abbr.: DH) junction structure. Thus, when a white LED of the complementary color type is formed, a complex and redundant process is required like the case of the RGB-type white LED.

Also when LEDs emitting light of different colors in a complementary relationship, such as blue light and yellow light, are closely arranged to constitute a white LED (see "Wide-gap semiconductor Opto and electronic device" (Mar. 31, 2006, Morikita Publishing Co., Ltd., first impression of the first edition), pp. 173-174), the total plane area of the light-emitting layer emitting blue or yellow light is smaller than the plane area required for arranging the LED, and therefore, it is not necessarily advantageous to obtain a light-emitting device with high luminous intensity.

In addition, in the complementary color type white LED, there is a problem that the color tone of resulting white light is slightly changed, depending on the wavelength of light of two colors in a complementary relationship that are mixed with each other to obtain the white light. In the complementary color type white LED, colors of at most two lights with different wavelengths are usually mixed, and therefore, in any case, it is technically difficult to stably obtain a white LED exhibiting high and stable color rendering properties.

In the fluorescent-type white LED, in order to stably obtain white light with a fixed color tone by excitation of the phosphor, the wavelength of the light emitted from the light-emitting layer, which acts as an excitation light, should be kept constant with good reproducibility, and thus it is technically difficult. Further, the composition of, for example, $Y_3Al_5O_{12}$ used as a phosphor and containing a rare-earth element should be artificially and finely adjusted according to variation in the wavelength of emission from the light-emitting layers.

The present invention has been proposed in view of the above circumstances and an object thereof is to provide a Group III nitride semiconductor light-emitting device which has a simple structure that can be easily formed, can enhance luminous intensity, can obtain high and stable color rendering properties, and does not need fine adjustment of a composition of a phosphor.

DISCLOSURE OF THE INVENTION

In order to achieve the above objects, (1) a first aspect of the invention is characterized in that, in a Group III nitride semiconductor light-emitting device which comprises a substrate and a light-emitting layer having the multiple quantum well structure that comprises barrier layers and well layers formed of a gallium-containing Group III nitride semiconductor material provided on the substrate, each of the well layers constituting the multiple quantum well structure is made of a Group III nitride semiconductor layer having the same conductivity type as that of the barrier layer, acceptor impurities are added to the well layers, and the well layers have thicknesses different from one another;

(2) according to a second aspect of the invention, in the constitution of the invention described in (1), the thickness of the well layers constituting the multiple quantum well structure is sequentially reduced from a surface side of the substrate toward a direction of taking out the light emission from light-emitting layer;

(3) according to a third aspect of the invention, in the constitution of the invention described in (1) or (2), the well layers constituting the multiple quantum well structure are different from one another in atomic concentration of the acceptor impurities; and (4) according to a fourth aspect of the invention, in the constitution of the invention described in any one of (1) to (3), the substrate is formed of a silicon single crystal, magnesium as the acceptor impurities is intentionally added to each of the well layers constituting the multiple quantum well structure.

According to the first aspect of the invention, the light-emitting layer has the multiple quantum well structure comprising the barrier layers and the well layers. According to this constitution, a white light-emitting device can be easily formed with a simple structure, and since the installation area is substantially the same as the plane area of the light-emitting layer, the luminous intensity can be enhanced. Although only one light-emitting layer is provided, by virtue of the use of the light-emitting layer having the multiple quantum well structure capable of providing multiwavelength emission, only the single light-emitting layer may be provided with p-type and n-type electrodes. As compared with the case of the conventional RGB-type white LED, a region of the light-emitting layer that should be scraped and removed can be significantly reduced, and the luminous efficiency can be improved.

In particular, since the well layer is constituted of a plurality of well layers having different thicknesses, the wavelengths of a plurality of emissions from the well layers providing multicolor emission can be superimposed, and high and stable color rendering properties of white light emission can be obtained. Since the white light can be obtained even without using a fluorescent material, the fine composition adjustment of a phosphor is not required.

Further, since the acceptor impurities are intentionally added to each well layer, the well layer which independently provides multicolor emission with different wavelengths can be constituted, and the single light-emitting layer having the multiple quantum well structure, which can independently provide multicolor emission, can be provided. Therefore, the high and stable color rendering properties of white light emission can be obtained. Furthermore, since the white light can be obtained even without using a fluorescent material, the fine composition adjustment of a phosphor is not required.

Furthermore, since the well layer is constituted of a layer providing the same conductivity type as that of the barrier layer, the formation of p-n junction with the barrier layer can be prevented, and thus the light-emitting layer having the multiple quantum well structure with excellent conductivity can be constituted.

According to the second aspect of the invention, the well layers each made of a Group III nitride semiconductor layer are arranged so that the thickness of the well layers is sequentially reduced from the surface side of the substrate toward the direction of taking out the light emission from the light-emitting layer, whereby the light-emitting layer having the multiple quantum well structure is constituted. Therefore, light emitted from each well layer constituting the multiple quantum well structure can be efficiently taken in a visual field direction.

Although short-wavelength emission is absorbed in the well layer emitting long-wavelength light, in the constitution of the second aspect of the invention, the well layers which have a large width and emit multiwavelength light having a low quantum level and including a long-wavelength emission component are arranged on the surface side of the substrate, and the well layers which have a small width and emit multiwavelength light having a high quantum level and including a shorter wavelength emission component are arranged in the light taking out direction, whereby the light-emitting layer having the multiple quantum well structure is constituted. Namely, none of short-wavelength emissions passes through the well layers emitting light with a longer wavelength. Therefore, in the constitution of the second aspect of the invention, the light emitted from the well layers arranged on the surface side of the substrate is not absorbed in the well layers arranged in the light taking out direction, but can be taken out in the external visual field direction, and thus the light emitted from each well layer can be efficiently taken out in the visual field direction. In addition, a white LED with excellent color rendering properties and high intensity can be realized.

According to the third aspect of the invention, the light-emitting layer having the multiple quantum well structure is constituted by using a plurality of well layers having different atomic concentrations of the acceptor impurities added thereto and providing a plurality of emissions with different wavelengths. Consequently, the single light-emitting layer independently providing multiwavelength emission can be obtained, and it is possible to provide a white LED with more excellent color rendering properties than, for example, the so-called complementary color type white LED which provides white light by mixing two lights which are in a relationship of complementary colors and have different wavelengths.

BEST MODE FOR CARRYING OUT THE INVENTION

Figure 1:
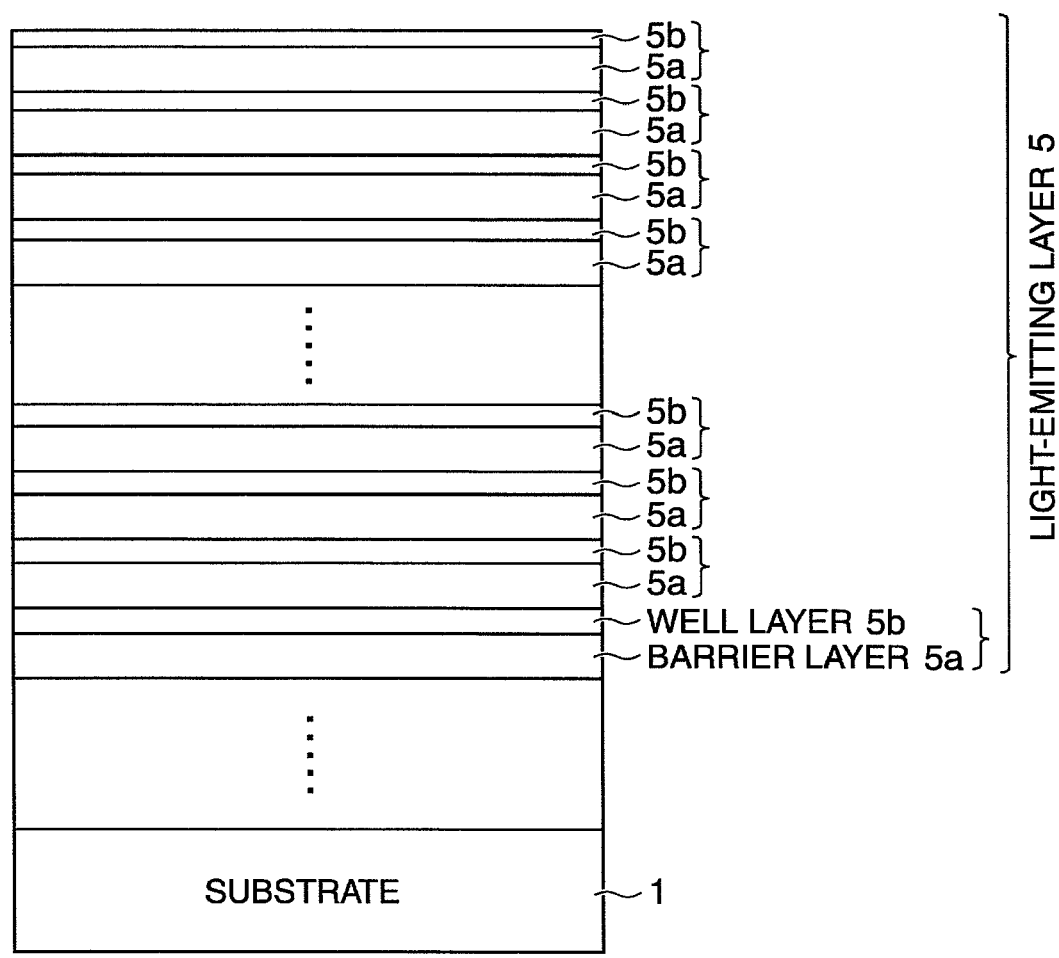
FIG. 1 is a schematic view schematically showing a cross-sectional structure of a Group III nitride semiconductor light-emitting device of the present invention.

Embodiments of the present invention will be described in detail referring to the drawings.

FIG. 1 is a schematic view schematically showing a cross-sectional structure of a Group III nitride semiconductor light-emitting device of the present invention. As shown in FIG. 1, the Group III nitride semiconductor light-emitting device of the present invention is a white light-emitting device comprising a substrate 1 and a light-emitting layer 5 having a multiple quantum well structure comprising barrier layers 5a and well layers 5b formed of a gallium-containing Group III nitride semiconductor material provided on the surface of the substrate 1. Each of the well layers 5b constituting the multiple quantum well structure is made of a Group III nitride semiconductor layer having the same conductivity type as that of the barrier layer 5a. Acceptor impurities are added to the well layers 5b, and the well layers 5b are formed to have thicknesses different from one another.

Examples of the substrate 1 may include a substrate formed of an insulating or electroconductive crystalline oxide such as sapphire ($\alpha$-$Al_2O_3$ single crystal) and zinc oxide (ZnO) with a polar or nonpolar crystal face as its surface, carbide crystal such as 6H, 4H, or 3C silicon carbide (SiC), and semiconductor crystal of silicon (Si). Particularly, silicon single crystal having an n-type or p-type conductivity and having a {111} crystal face as its surface can be suitably used as the substrate for use in formation of the multiple quantum well structure on its surface, according to the present invention.

In the present invention, the well layer 5b constituting the multiple quantum well structure formed on the surface of the substrate 1 is made of a material which can independently and simultaneously emit light with a plurality of different wavelengths. Considering the color rendering properties of light emitted from LED, it is preferable that a large number of lights (with multiple wavelengths) emitted from the well layer 5b are dispersed in a wide wavelength range. In order to obtain multiwavelength emissions over a wide wavelength range, it is preferable that in the multiple quantum well structure, the well layer 5b is formed of a semiconductor material with a large band gap energy. The semiconductor material with a large band gap energy may include a Group III nitride semiconductor material containing gallium (Ga). For example, the well layer 5b can be preferably made of a wide band gap semiconductor material such as gallium nitride (GaN) and $Ga_xIn_{1-x}N$ ($0<x<1$) that is a mixed crystal of gallium nitride (GaN) and indium nitride (InN).

The barrier layer 5a constituting the multiple quantum well structure along with the well layer 5b is made of, for example, a Group III nitride semiconductor material with a band gap energy larger than the well layer 5b. For example, for the well layer 5b made of a mixed crystal $Ga_{0.85}In_{0.15}N$, the barrier layer 5a is made of GaN. The barrier layer 5a and the well layer 5b constituting the multiple quantum well structure are made of layers having the same conductivity type. For example, the n-type well layer 5b and the n-type barrier layer 5a constitute the n-type multiple quantum well structure as a whole. According to this constitution, the formation of p-n junction between the well layer 5b and the barrier layer 5a can be avoided, and thus the light-emitting layer 5 having the multiple quantum well structure with excellent conductivity can be constituted.

When the well layer 5b and the barrier layer 5a are made to have the same conductivity type, impurities are not essentially added to the well layer 5b. For example, in a so-called undoped state that impurities are not intentionally added, or in a growth environment for the formation of the well layer 5b, when the carrier concentration is in a range of not less than $5\times10^{17}$ $cm^{-3}$ and not more than $5\times10^{19}$ $cm^{-3}$ due to unintended contamination of impurities due to negligence, the well layer can be utilized as the well layer 5b according to the present invention.

In the present invention, the well layer 5b constituting the multiple quantum well structure is particularly made of a Group III nitride semiconductor layer containing Ga and acceptor impurities added thereto. For example, while the same n-type conductivity type as that of the barrier layer 5a is maintained, the well layer 5b is made of n-type mixed crystal $Ga_{0.75}In_{0.25}N$ containing the acceptor impurities added thereto. The well layer 5b having the same conductivity type as that of the barrier layer 5a and containing the acceptor impurities, by virtue of mixing of colors, can independently provide multiwavelength light composed of wavelengths that are different from each other and advantageous to obtain white light.

A technique of forming the light-emitting layer 5 containing GaInN and zinc (Zn) added as the acceptor impurities is disclosed (see, JP-B No. 55-3834). However, the well layer 5b to which only Zn has been added as the acceptor impurities has a large resistance and fails to be stably formed so as to have a sufficient conductivity. On the other hand, in the formation of the well layer 5b according to the present invention, magnesium (Mg) among Group II impurities that can be used as an acceptor for the Group III nitride semiconductor can be suitably used.

The light-emitting layer 5 having the multiple quantum well structure according to the present invention can be formed by a vapor-phase epitaxy method, such as a metal organic chemical vapor deposition (abbreviated to, for example, MOCVD or MOVPE) method, a molecular beam epitaxy (MBE) method, a hydride method, and a halide method. Particularly, in the MBE method, the barrier layer 5a and the well layer 5b can be formed at a lower temperature as compared with the other vapor-phase epitaxy methods. Therefore, for example, the MBE method is growth means advantageous in terms of preventing Mg atoms which are used for the formation of the well layer 5b according to the present invention from thermally diffusing into the barrier layer 5a.

The thickness of the well layer 5b containing Mg as the acceptor impurities is preferably not less than 1 nm and not more than 20 nm. An extremely thin well layer 5b having a thickness of less than 1 nm lacks two-dimensional continuity of layers (films) and therefore results in increase of an electrical resistance related to conduction of operating current to a light-emitting device, especially current diffusion in a horizontal (lateral) direction or results in decrease in a light-emitting region. Thus, the extremely thin well layer 5b is disadvantageous. On the other hand, even when the well layer 5b having a film thickness of more than 20 nm is used, many quantum levels different in energy level cannot be satisfactorily formed. Thus, this well layer is also disadvantageous in that many emissions with different wavelengths based on transition between various quantum levels cannot be obtained.

Further, in the MBE method, the Group III nitride semiconductor layer can typically be grown under a vacuum environment free from hydrogen. Therefore, the MBE method is advantageous in terms of easily forming, for example, a low resistance p-type $Ga_xIn_{1-x}N$ ($0 \leqq X \leqq 1$) layer containing a large amount of electrically activated Mg (operated as an acceptor). For example, according to the MBE method using a nitrogen ($N_2$) plasma as a nitrogen source, when the concentration of Mg atoms in a layer is $1.5 \times 10^{19}$ cm$^{-3}$, a low resistance p-type GaN layer having a carrier concentration of $8.0 \times 10^{18}$ cm$^{-3}$ can be formed. Thus, the electrical activation ratio of Mg (as a matter of convenience, it is represented by a value (%) obtained by dividing the carrier concentration by the concentration of Mg atoms) is 53% in an as-grown state. As described in this example, according to the MBE method, like the Mg-doped GaN layer grown by MOCVD method, it is advantageous that the p-type $Ga_xIn_{1-x}N$ ($0 \leqq X \leqq 1$) layer with the electrical activation ratio of not less than 50% can be easily formed without requiring a dehydrogenation treatment for the same layer.

Figure 2:
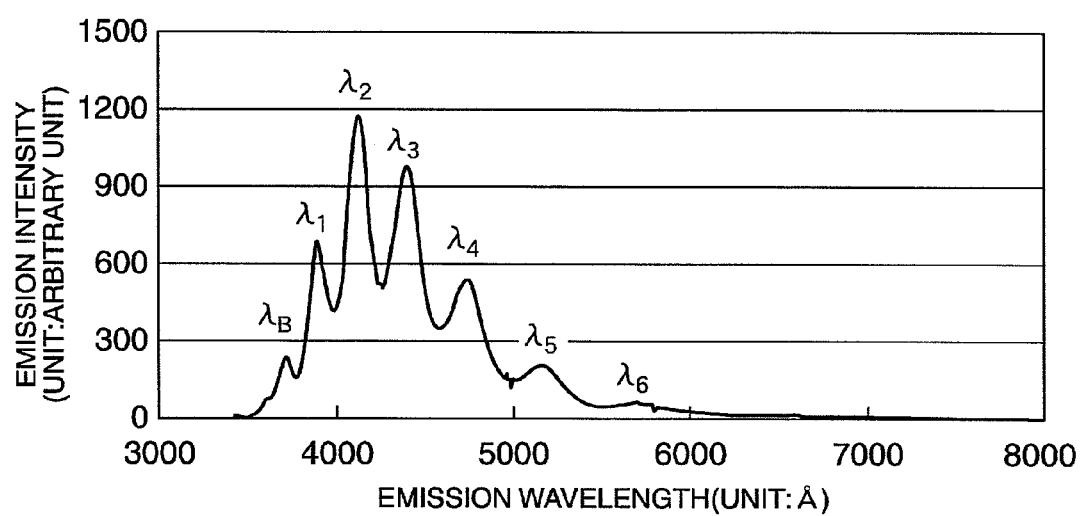
FIG. 2 shows an example of a multiwavelength emission spectrum from a light-emitting layer having the multiple quantum well structure according to the present invention.

When the multiple quantum well structure is constituted by a pair of structural units comprising a joint structure of one well layer 5b containing the acceptor impurities such as Mg and one barrier layer 5a having the same conductivity type as that of the well layer 5b, the number of the pairs of structural units constituting the multiple quantum well structure is preferably not less than 3 pairs and not more than 40 pairs. Even when only one well layer 5b according to the present invention is provided, the well layer 5b can emit multiwavelength light; however, in order to obtain emission of light with more excellent color rendering properties, the number of the pairs of structural units is preferably not less than 4. FIG. 2 shows an example of a photoluminescence (abbr.: PL) spectrum of the light-emitting layer 5 having the multiple quantum well structure which comprises 30 pairs of the well layer 5b made of Mg-doped n-type mixed crystal $Ga_{0.85}In_{0.15}N$ grown by the MBE method and the GaN barrier layer 5a grown by the MBE method (one pair is an assembly of one barrier layer 5a and one well layer 5b). The thickness of the well layer 5b constituting the multiple quantum well structure is 4 nm, and the thickness of the barrier layer 5a is 10 nm. In FIG. 2, the horizontal axis represents emission wavelength (unit: Å), and the vertical axis represents emission intensity (unit: arbitrary unit).

As shown in the photoluminescence spectrum exemplified in FIG. 2, the light-emitting layer 5 having the multiple quantum well structure according to the present invention, comprising the well layer 5b containing the acceptor impurities, emits three lights (represented by $\lambda_2$ to $\lambda_4$ in FIG. 2) with different wavelengths in a wavelength range of not less than 400 nm (4000 angstroms) and not more than 500 nm (5000 angstroms). Separately from emission (represented by $\lambda_B$ in FIG. 2) corresponding to a band-edge emission, a total of six lights (represented by $\lambda_1$ to $\lambda_6$ in FIG. 2) with different wavelengths can be emitted in a wavelength range of not less than the wavelength of the band-edge emission (in this example, 365 nm) and not more than 650 nm.

Among a plurality of lights ($\lambda_1$ to $\lambda_6$) with wavelength different from the band-edge emission ($\lambda_B$), a difference in wavelength between the adjacent lights (for example, $\lambda_1$ and $\lambda_2$, $\lambda_3$ and $\lambda_4$) is 17.5 nm between lights on the short wavelength side, for example, $\lambda_1$ and $\lambda_2$; however, it is characterized in that as the wavelength of light emission is longer, the difference in wavelength between emissions tends to become gradually larger, and the difference in wavelength between the lights $\lambda_5$ and $\lambda_6$ is 55.5 nm. The aspects of appearance of the emission peak of the multiwavelength light is different from the aspects of appearance of the so-called shoulder peak generated in a "shoulder part" of a major photoluminescence spectrum from the light-emitting layer 5 formed by the MOCVD method and doped with Si and Mg, as can also be clearly seen in the interval of the wavelength between emitted lights. The reason that the multiwavelength lights are emitted even when the well layers have a fixed thickness is attributed to the fact that various levels providing radiation recombination are formed due to addition of an acceptor.

In the case of forming the light-emitting layer 5 having multiple quantum well structure by using the well layer 5b according to the present invention, which can independently and simultaneously emit the multiwavelength light, when the well layers 5b containing the acceptor impurities are arranged so that the thickness of the well layers 5b is reduced from the surface side of the substrate 1 toward the direction of taking out the light emission from the light-emitting layer 5, it is advantageous in obtaining a white LED excellent in an efficiency of taking light emission to the outside. The well layer 5b having a small thickness emits the multiwavelength light containing many short-wavelength emission components. On the other hand, the well layer 5b having a large thickness emits the multiwavelength light containing many emission components of long-wavelength light. The short-wavelength emission is absorbed in the well layer 5b leading to long-wavelength emission. Therefore, when the well layers 5b are arranged so that the thickness of the well layers 5b is reduced from the surface side of the substrate 1 toward the direction of taking out the light emission from the light-emitting layer 5, it is suitable for preventing the light emitted from the well layer 5b located on the surface side of the substrate 1 from being absorbed, and transmitting the light toward an external visual field direction.

When the multiple quantum well structure is produced using the well layers 5b having different thicknesses from one another, the lights with different wavelengths are emitted from the well layers 5b depending on the thickness, and these lights can be superimposed to be taken outside. Therefore, a white LED with excellent color rendering properties can be provided. For example, even when the well layer 5b having a thickness suitable for mainly providing light in a band of any of red, green, and blue and emitting the multiwavelength emission is arranged, the white LED with excellent color rendering properties can be constituted. For example, a plurality of well layers 5b emitting light in a band having a low luminosity factor and having the same thickness are arranged, and further well layers 5b are arranged above the well layers 5b so that the thickness of the upper well layers 5b are sequentially reduced in the direction of taking out light emission, whereby the multiple quantum well structure of the light-emitting layer 5 may be constituted.

With regard to the well layers 5b providing the light in a band of any of red, green and blue, as the main component, each of the well layers 5b made of mixed crystal $Ga_xIn_{1-x}N$ ($0<X<1$) can be formed so that the composition (1-X) of indium is varied. However, in accordance with a growth method such as the MBE method and the MOCVD method, a growth temperature of the well layers 5b and supply ratios of Ga and In raw materials are required to be changed to form the well layers 5b with the varied In compositions. Therefore, under the conditions of the same growth temperature and the raw material supply ratio, compared with the technique of simply adjusting the growth time to control the thickness of the well layer 5b, a troublesome operation should be performed.

The wavelength of the light emitted from each of the well layers 5b varying in atomic concentration of the acceptor impurities varies according to the atomic concentration of the acceptor impurities. Thus, even when the thickness of the well layers 5b is fixed, the atomic concentration of the acceptor impurities contained in the well layer 5b is changed, whereby it becomes more suitable for control of the wavelength range allowing the appearance of the multiwavelength light. For example, in an Mg doped n-type $Ga_{0.75}In_{0.25}N$ well layer 5b, when the light-emitting layer 5 having the multiple (triple) quantum well structure is formed using the well layers 5b whose concentrations of Mg atoms contained therein varies as $1\times10^{19}$ atoms/cm$^3$, $8\times10^{18}$ atoms/cm$^3$, and $2\times10^{18}$ atoms/cm$^3$, the multiwavelength light can be allowed to appear in the wavelength range of not less than 400 nm and not more than 600 nm.

As described above, in the present invention, the light-emitting layer 5 has the multiple quantum well structure comprising the barrier layers 5a and the well layer 5b, and therefore, the light-emitting layer providing multiple wavelength can be easily formed with a simple structure, and since the installation plane area is substantially the same as the plane area of the light-emitting layer 5, the luminous intensity can be enhanced. Further, since a single light-emitting layer 5 is provided, a p-type or n-type electrode may be provided so as to correspond only to the light-emitting layer 5, and as compared with the case of the RGB-type white LED and the complementary color type white LED, the area of the light-emitting layer 5 to be scraped can be significantly reduced, whereby a light-emission efficiency can be improved.

Furthermore, the well layers 5b are constituted of a plurality of well layers 5b different in thickness, whereby each of the well layers 5b can emit multicolor lights with wavelengths different from one another, white light emission with high and stable color rendering properties can be obtained, and white light can be obtained without using a fluorescent material. Therefore, fine composition adjustment of a phosphor is not required.

Furthermore, the acceptor impurities are intentionally added to each well layer 5b, and therefore, the light-emitting layer 5, which emits multicolor lights with different wavelengths while only one light-emitting layer 5 is provided, can be constituted. By virtue of the multicolor emission property, the high and stable color rendering properties of white light emission can be obtained, and white light can be obtained without using a fluorescent material. Therefore, fine composition adjustment of a phosphor is not required.

Furthermore, since the well layer 5b is made of a layer having the same conductivity type of that of the barrier layer 5a, the formation of p-n junction between the well layer 5b and the barrier layer 5a can be avoided, and thus the light-emitting layer 5 having the multiple quantum well structure with excellent conductivity can be formed.

Furthermore, the light-emitting layer 5 having the multiple quantum well structure is formed so that the well layers 5b each made of a Group III nitride semiconductor layer are arranged so that the thickness of each of the well layers 5b is sequentially reduced from the surface side of the substrate 1 toward the direction of taking out the light emission from the light-emitting layer 5, whereby the light emitted from each of the well layers 5b constituting the multiple quantum well structure can be efficiently taken in the visual field direction.

Specifically, in order to prevent short-wavelength light from being absorbed in a well layer emitting long-wavelength light, the well layers 5b which have a large layer width and emit multiwavelength light having a low quantum level and including a long-wavelength emission component are arranged on the surface side of the substrate 1, and the well layers 5b which have a small layer width and emit multiwavelength light having a high quantum level and including a shorter wavelength emission component are arranged in the light taking out direction, whereby the light-emitting layer 5 having the multiple quantum well structure is formed. Under this structure, short-wavelength emission does not pass through the well layer 5b emitting longer wavelength light. Therefore, the light emitted from the well layers 5b arranged on the surface side of the substrate is not absorbed in the well layers 5b arranged in the light taking out direction, the emitted light can be taken out in the external visual field direction, and the light emitted from each well layer 5b can be efficiently taken out in the visual field direction. In addition, a white LED with excellent color rendering properties and high intensity can be realized.

According to the present invention, the light-emitting layer 5 having the multiple quantum well structure is formed using a plurality of well layers 5b, which contain acceptor impurities with different atomic concentrations and provide a plurality of emissions with different wavelengths while only one light-emitting layer is provided. Therefore, the light-emitting layer 5 providing multiwavelength emission comprising superimposed lights emitted from respective well layers 5b is obtained, and it is possible to provide a white LED with more excellent color rendering properties than, for example, the so-called complementary color type white LED which provides white light by mixing two lights which are in a relation of complementary colors and have different wavelengths.

Hereinafter, embodiments of the Group III nitride semiconductor light-emitting device of the present invention will be described with reference to the drawings.

First Embodiment

Figure 3:
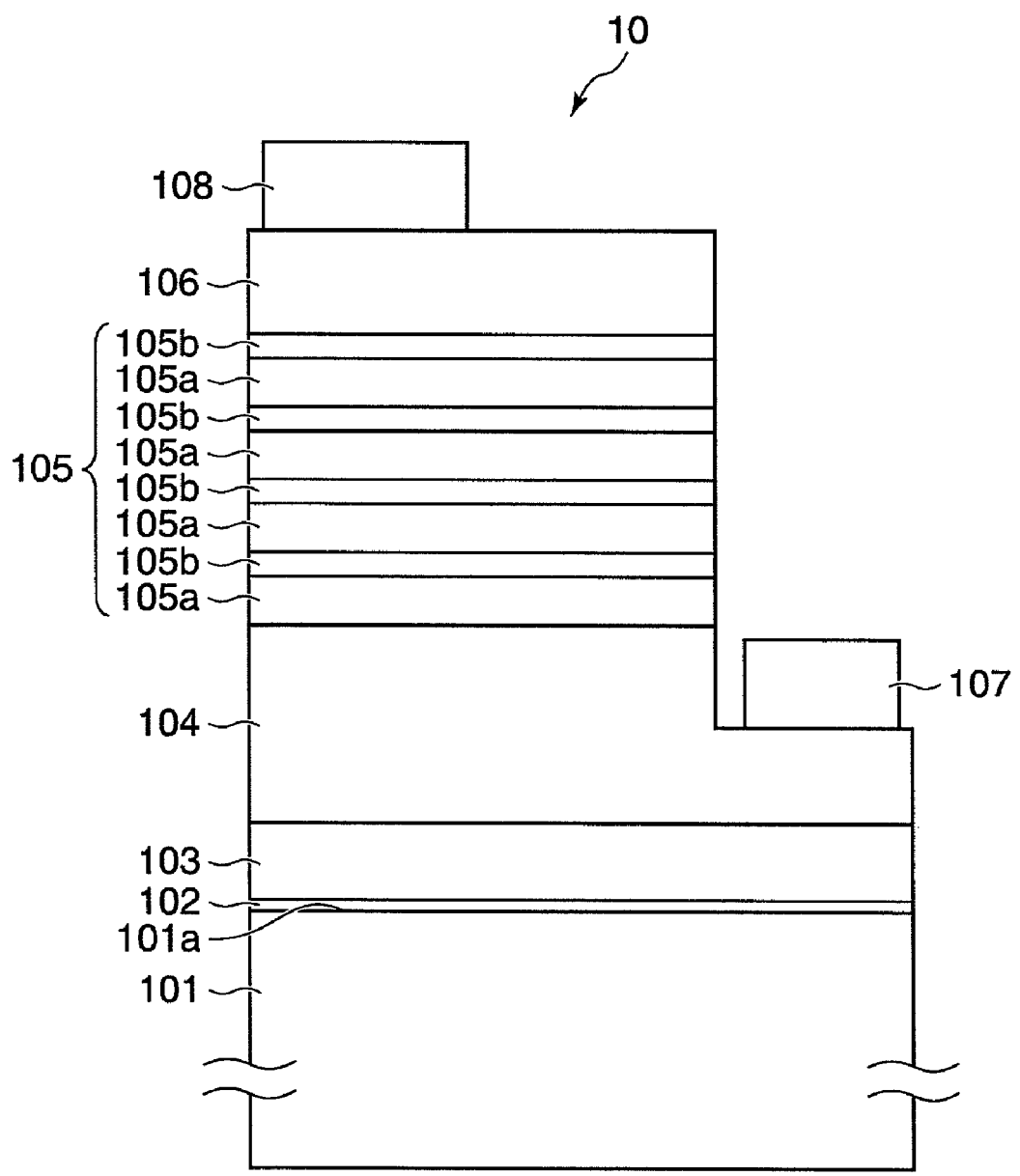
FIG. 3 is a schematic cross-sectional view of an LED according to a first embodiment.
Figure 4:
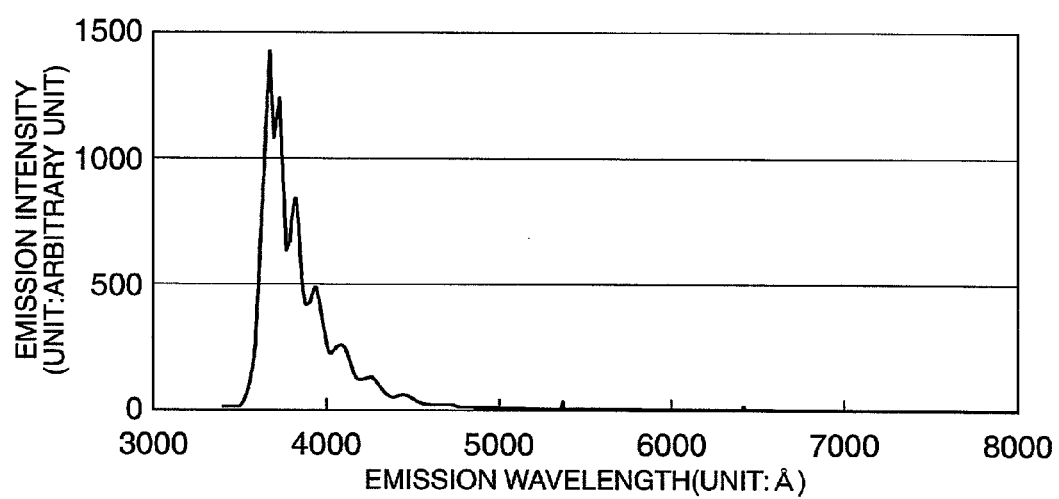
FIG. 4 shows a multiwavelength emission spectrum from a stacked structure described in the first embodiment.

FIG. 3 is a schematic cross-sectional view showing a structure of a Group III nitride semiconductor light-emitting device comprising a light-emitting layer having the multiple quantum well structure of a first embodiment. FIG. 4 shows a photoluminescence spectrum radiated from the light-emitting layer having the multiple quantum well structure. In FIG. 4, the horizontal axis represents emission wavelength (unit: Å), and the vertical axis represents emission intensity (unit: arbitrary unit).

In the formation of a structure for use in production of a Group III nitride semiconductor light-emitting device 10, a {111} silicon single crystal (silicon) was used as a substrate 101.

The surface of the substrate 101 was cleaned with an inorganic acid, and thereafter the substrate 101 was conveyed into a growth chamber of a molecular beam epitaxy (MBE) growth system. The growth chamber was then evacuated to ultra-high vacuum. Thereafter, the temperature of the substrate 101 was increased to 780° C. while keeping the degree of vacuum in the growth chamber, and the substrate 101 was continuously heated until the surface 101a of the substrate 101 provides reconstitution of a (7×7) structure.

By virtue of an MBE growth method (nitrogen plasma MBE) using nitrogen converted into plasma as a nitrogen source, an undoped aluminum nitride (AlN) layer 102 (with a thickness of 60 nm) was formed on the surface 101a of the substrate 101 having been cleaned so that the reconstitution of the (7×7) structure is provided. An undoped aluminum gallium nitride mixed crystal ($Al_xGa_{1-x}N$) layer 103 (with a thickness of 300 nm) was accumulated on the AlN layer 102 by nitrogen plasma MBE. The aluminum (Al) composition ratio (X) of the $Al_xGa_{1-x}N$ layer constituting the mixed crystal layer 103 was continuously changed from 0.25 to 0 from the joint surface with the AlN layer 102 under the mixed crystal layer 103 toward the surface of the mixed crystal layer 103.

A silicon (Si) doped n-type GaN layer 104 (with a thickness of 1200 nm) was accumulated on the $Al_xGa_{1-x}N$ layer 103 by nitrogen plasma MBE. The carrier concentration was $8 \times 10^{18}$ cm$^{-3}$.

An n-type GaN layer 105a (with a thickness of 10 nm) which is a barrier layer having a multiple quantum well structure was accumulated on the n-type GaN layer 104 by nitrogen plasma MBE while the temperature of the substrate 101 was kept at 540° C. Then, the well layer (with a thickness of 2 nm) 105b comprising n-type gallium indium nitride mixed crystal ($Ga_{0.99}In_{0.01}N$) containing magnesium (Mg) is provided by nitrogen plasma MBE so that the well layer 105b is joined to the n-type GaN barrier layer 105a at 540° C. Four pairs of structural units which each comprise the n-type barrier layer 105a and the n-type well layer 105b were stacked to provide a light-emitting layer 105 having the multiple quantum well structure that has n-type conductivity as a whole. According to a general secondary ion mass spectrometry, the atomic concentration of Mg contained in the well layer is $4 \times 10^{17}$ atoms/cm$^3$.

FIG. 4 shows the photoluminescence spectrum at room temperature obtained from the light-emitting layer 105 having the multiple quantum well structure that comprises the barrier layer 105a and the well layer 105b grown under a high vacuum environment of about $10^{-6}$ Pascals (Pa) substantially free from hydrogen. In order to demonstrate that even when only one light-emitting layer is provided, a large number of lights with different wavelengths are emitted from the light-emitting layer, emission peak wavelengths and intensities at the emission peak wavelengths are collectively shown in the following table 1.

TABLE 1

| Emission peak wavelength (Unit: nm) | Emission intensity (Unit: mV) |
|---|---|
| 366.5 | 103.93 |
| 372.5 | 90.23 |
| 381.5 | 61.23 |
| 394.0 | 35.74 |
| 409.0 | 19.48 |
| 422.5 | 9.74 |
| 447.0 | 4.61 |
| 537.0 | 2.64 |

Even in a single light-emitting layer, the light-emitting layer emits a total of seven lights in a wavelength range of more than the wavelength of the band-edge emission (366.5 nm) and less than the wavelength of 550 nm. A difference in wavelength between the adjacent emission peaks is not less than 6 nm and not more than 90 nm. As the wavelength of light emission is longer, the interval (difference in wavelength) between the adjacent emission peaks tends to be larger. The reason why the multiwavelength emission is provided even when the thickness of the well layers is fixed and the atomic concentration of the acceptor is constant seems to be that the well layers are formed under a high vacuum environment with little or no hydrogen, and thus the well layer can contain a large amount of electrically-active Mg, and many levels capable of contributing to many radiative recombinations can be formed by virtue of the electrically-active Mg.

A $Ga_{0.80}In_{0.20}N$ well layer 105b which is the terminal end (the outermost surface layer) of the light-emitting layer 105 having the multiple quantum well structure has thereon a Mg-doped p-type GaN layer 106 (with a thickness of 100 nm) provided by nitrogen plasma MBE, whereby the formation of the structure is terminated. The atomic concentration of Mg contained in the p-type GaN layer 106 is $1 \times 10^{19}$ cm$^{-3}$, and the carrier concentration of the p-type GaN layer 106 is $8 \times 10^{18}$ cm$^{-3}$. Namely, the electrical activation ratio is 80%.

A region where an n-type ohmic electrode is formed was removed by a typical dry etching method to form an n-type ohmic electrode 107. Meanwhile, a p-type ohmic electrode 108 was formed on the surface of the p-type GaN layer 106, and a light-emitting device (LED) 10 having a square shape with a side length of 350 µm was produced.

When the forward current of the light-emitting device (LED) 10 was 20 mA, the forward voltage (Vf) was 3.5. When a current of 50 mA was passed in a forward direction, white light tinged with green visually was emitted from the entire surface of the light-emitting layer of the LED 10 in a chip state. When the color rendering properties of the light emission obtained at the time when the forward current of 50 mA was passed is represented by a coordinate value on a chromaticity diagram, the x coordinate value is 0.26, the y coordinate value is 0.38, and thus the z coordinate value is 0.36.

Second Embodiment

Figure 5:
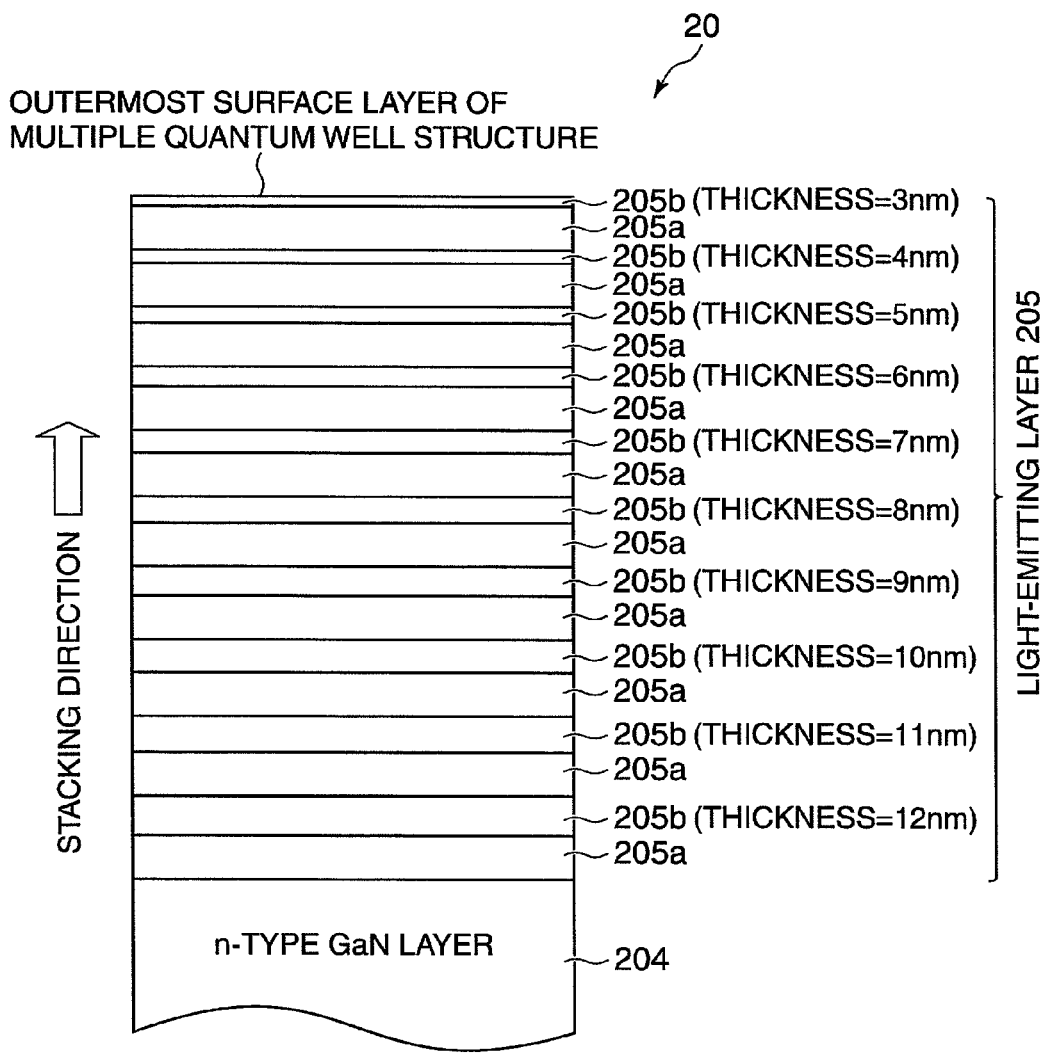
FIG. 5 is a schematic cross-sectional view of a light-emitting layer having the multiple quantum well structure described in a second embodiment.

FIG. 5 is a cross-sectional view schematically showing a constitution of a light-emitting layer having the multiple quantum well structure of a Group III nitride semiconductor light-emitting device (LED) of the second embodiment.

A light-emitting layer 205 having the multiple quantum well structure shown in FIG. 5 was formed, by nitrogen plasma MBE, on a stacked structure comprising the AlN layer, the AlGaN mixed crystal layer, and the n-type GaN layer (204 in FIG. 5) described in the first embodiment and provided on the Si substrate. The light-emitting layer 205 was formed as follows.

In the formation of the light-emitting layer 205 having the multiple quantum well structure, an n-type GaN barrier layer 205a having a thickness of 16 nm is first provided on the n-type GaN layer 204 by nitrogen plasma MBE. Then, an Mg doped $Ga_{0.80}In_{0.20}N$ well layer as an n-type well layer 205b constituting the multiple quantum well structure was provided so that the n-type well layer 205b is joined to this barrier layer 205a. Ten pairs of structural units which each comprise this n-type barrier layer 205a and the n-type well layer 205b are stacked to provide a light-emitting layer 305 having the multiple quantum well structure that has n-type conductivity as a whole.

The ten well layers 205b constituting the multiple quantum well structure that ten structural units were stacked on top of each other were reduced in thickness in the stacking direction from the n-type GaN layer 204 side toward the surface of the multiple quantum well structure. In the present embodiment, the stacking direction is the same as the direction of taking out light emission of the light-emitting device (LED). In the multiple quantum well structure, the lowermost well layer 205b has a thickness of 12 nm, the well layer 205b provided above the lowermost well layer 205b has a thickness of 11 nm, and the next lowest well layer 205b has a thickness of 10 nm. Namely, the thickness of the well layer 205b is reduced by 1 nm toward the outermost surface layer of the multiple quantum well structure, and the thickness of the outermost surface layer of the well layers 205b is 3 nm (see, FIG. 5). Although the thickness of each well layer 205b is changed, Mg was doped in each well layer 205b so that the atomic concentration is $6 \times 10^{17}$ atoms/cm$^3$ and substantially constant.

An Mg doped p-type $Al_{0.03}Ga_{0.97}N$ layer having a thickness of 10 nm was accumulated on an Mg doped $Ga_{0.80}In_{0.20}N$ well layer 205b (with a thickness of 3 nm), which is the outermost surface layer of the light-emitting layer 205 having the multiple quantum well structure, by nitrogen plasma MBE, whereby the formation of the stacked structure for use in a light-emitting device (LED) was terminated.

Figure 6:
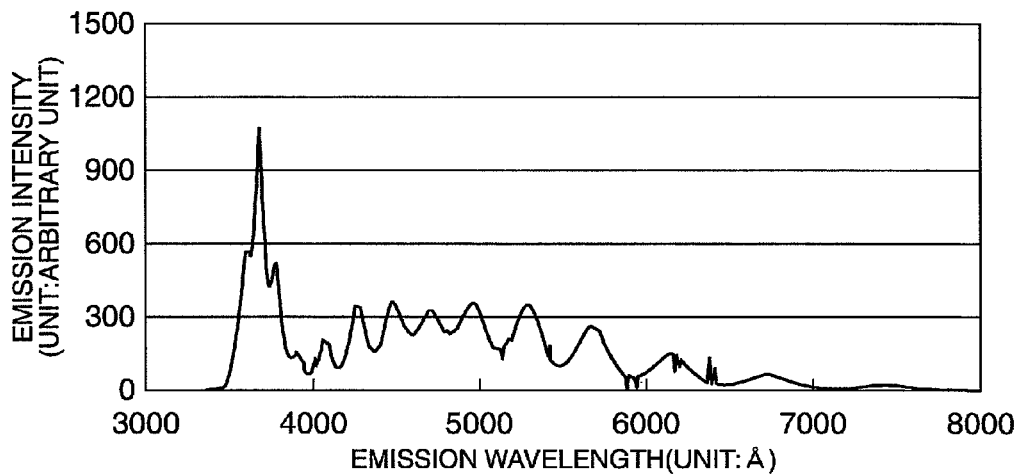
FIG. 6 shows a multiwavelength emission spectrum from a stacked structure described in the second embodiment.

FIG. 6 shows a photoluminescence spectrum at room temperature obtained from the stacked structure including the light-emitting layer 205 having the multiple quantum well structure. In FIG. 6, the horizontal axis represents emission wavelength (unit: Å), and the vertical axis represents emission intensity (unit: arbitrary unit). The photoluminescence spectrum shown in FIG. 6 is a spectrum obtained by superimposing the multiwavelength emission components from the well layers 205b with different thicknesses. A total of ten emissions were radiated over a wide wavelength range from 400 nm to 800 nm. The difference of the wavelength between the adjacent emissions is 17.5 nm to 78.0 nm, and the interval of the wavelength becomes larger as the emission wavelength becomes longer-wavelength. When a helium-cadmium (He—Cd) laser beam (with a wavelength of 325 nm) is irradiated as excitation light, the visually confirmed color of emission from the stacked structure is white.

As in the first embodiment, the region where an n-type ohmic electrode is formed is removed by a typical dry etching method to form the n-type ohmic electrode. Meanwhile, a p-type ohmic electrode is formed on the surface of the p-type $Al_{0.03}Ga_{0.97}N$ layer, and a light-emitting device (LED) is produced.

When the forward current of the light-emitting device (LED) is 20 mA, the forward voltage (Vf) is 3.4 V. When a current of 20 mA is passed in a forward direction, the LED in a chip state emits light of white color as a visible color.

Third Embodiment

Figure 7:
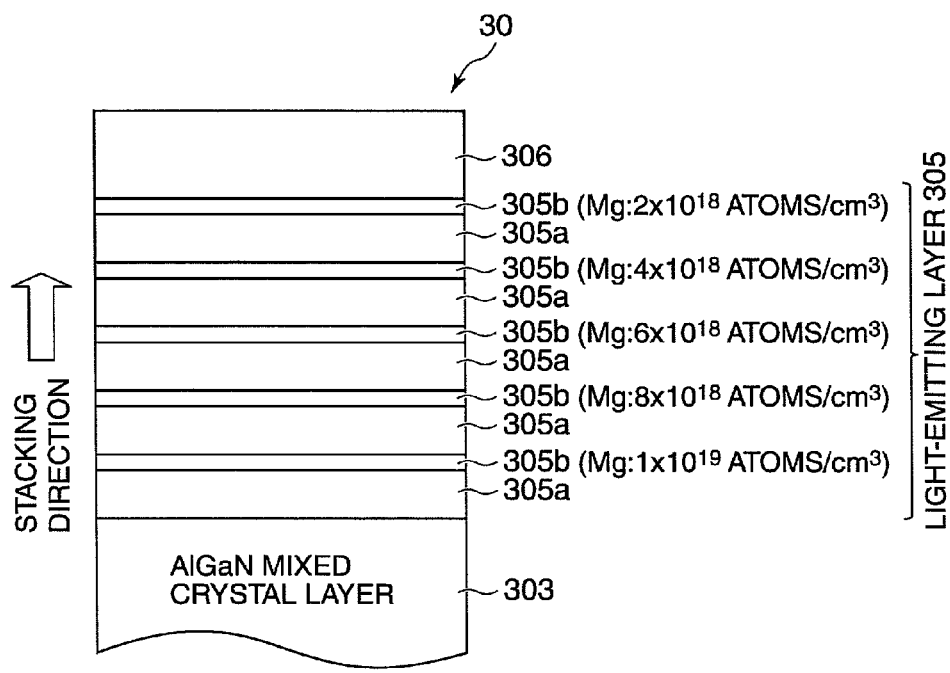
FIG. 7 is a schematic cross-sectional view of a light-emitting layer having the multiple quantum well structure described in a third embodiment.
Figure 8:
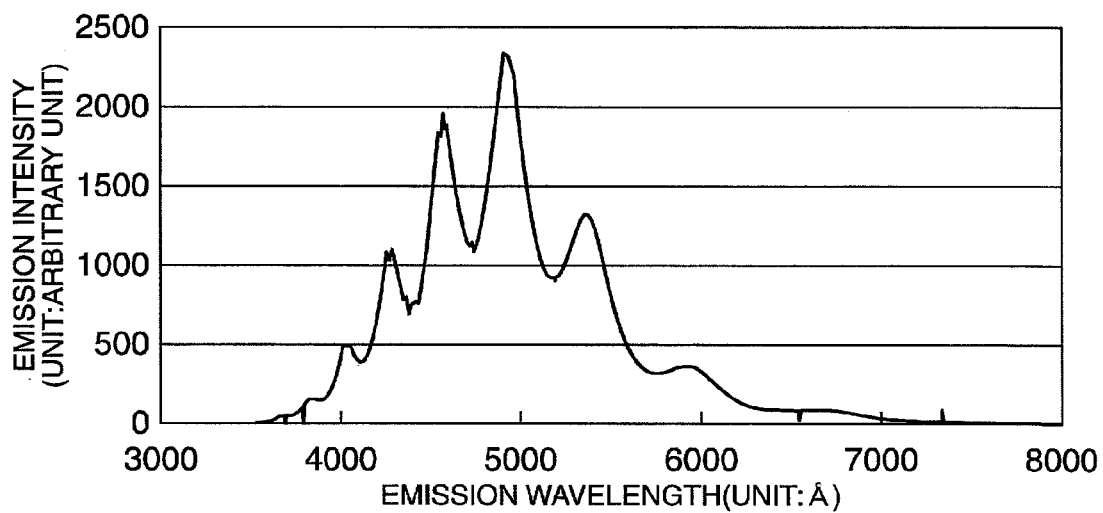
FIG. 8 shows a multiwavelength emission spectrum from a stacked structure described in the third embodiment.

FIG. 7 is a schematic cross-sectional view showing a structure of a Group III nitride semiconductor light-emitting device comprising a light-emitting layer having the multiple quantum well structure of a third embodiment. FIG. 8 is a photoluminescence spectrum in a stacked structure for use in a Group III nitride semiconductor light-emitting device (LED) comprising the light-emitting layer having the multiple quantum well structure of the third embodiment.

By virtue of nitrogen plasma BME, the light-emitting layer having the multiple quantum well structure was formed on the stacked structure that comprises the AlN layer and the AlGaN mixed crystal layer (303 in FIG. 7) described in the first and second embodiments and provided on an Si substrate. The light-emitting layer is formed as follows.

In the formation of the light-emitting layer having the multiple quantum well structure, an n-type GaN barrier layer 305a with a thickness of 10 nm was first provided on the AlGaN mixed crystal layer 303, described in the first and second embodiments, by nitrogen plasma MBE. Then, an Mg doped n-type $Ga_{0.75}In_{0.25}N$ well layer 305b with a thickness of 3 nm was provided so as to be joined to the barrier layer 305a. Five pairs of structural units each comprising the n-type barrier layer 305a and the n-type well layer 305b are stacked to provide a light-emitting layer 305 having the multiple quantum well structure that has n-type conductivity as a whole.

The atomic concentration of Mg contained within the five well layers 305b constituting the multiple quantum well structure of five structural units stacked on top of each other is reduced from the AlGaN mixed crystal layer 303 side toward the stacking direction (the same as the light taking out direction). In the multiple quantum well structure, the atomic concentration of Mg is sequentially reduced so that the atomic concentration of Mg contained within the lowermost well layer 305b is $1 \times 10^{19}$ atoms/cm$^3$, the atomic concentrations of Mg contained within the well layers 305b provided above the lowermost well layer 305b are respectively $8 \times 10^{18}$ atoms/cm$^3$, $6 \times 10^{18}$ atoms/cm$^3$, $4 \times 10^{18}$ atoms/cm$^3$, and $2 \times 10^{18}$ atoms/cm$^3$. This constitution provides the light-emitting layer 305 having the multiple quantum well structure comprising the five well layers 305b, which have different Mg atomic concentrations while each of the well layers 305b has the same thickness.

An Mg doped p-type GaN layer 306 with a thickness of 10 nm was accumulated on an Mg doped GaN well layer (with an Mg atomic concentration of $2 \times 10^{18}$ atoms/cm$^3$), which is the outermost surface layer of the light-emitting layer 305 having the multiple quantum well structure, by nitrogen plasma MBE, whereby the formation of the stacked structure for use in the light-emitting device (LED) was terminated.

FIG. 8 shows the photoluminescence spectrum at room temperature obtained from the stacked structure including the light-emitting layer 305 having the multiple quantum well structure. In FIG. 8, the horizontal axis represents emission wavelength (unit: Å), and the vertical axis represents emission intensity (unit: arbitrary unit). The photoluminescence spectrum shown in FIG. 8 is a spectrum obtained by superimposing the multiwavelength emission components from the well layers 305b having a fixed thickness and different Mg atomic concentrations. A total of six emissions were confirmed in a wavelength range from 400 nm to 600 nm, and the respective emission peak wavelengths are 402.5 nm, 429.0 nm, 458.0 nm, 493.0 nm, 538.0 nm, and 593.0 nm. In the emissions appearing in the wavelength range from 400 nm to 600 nm, the difference of the wavelength between the adjacent emissions is 26.5 nm to 55.0 nm, and the interval of the wavelength becomes larger as the emission wavelength becomes longer-wavelength. When a helium-cadmium (He—Cd) laser beam (with a wavelength of 325 nm) is irradiated as excitation light, the visually confirmed color of emission from the stacked structure is blue-white.

Figure 9:
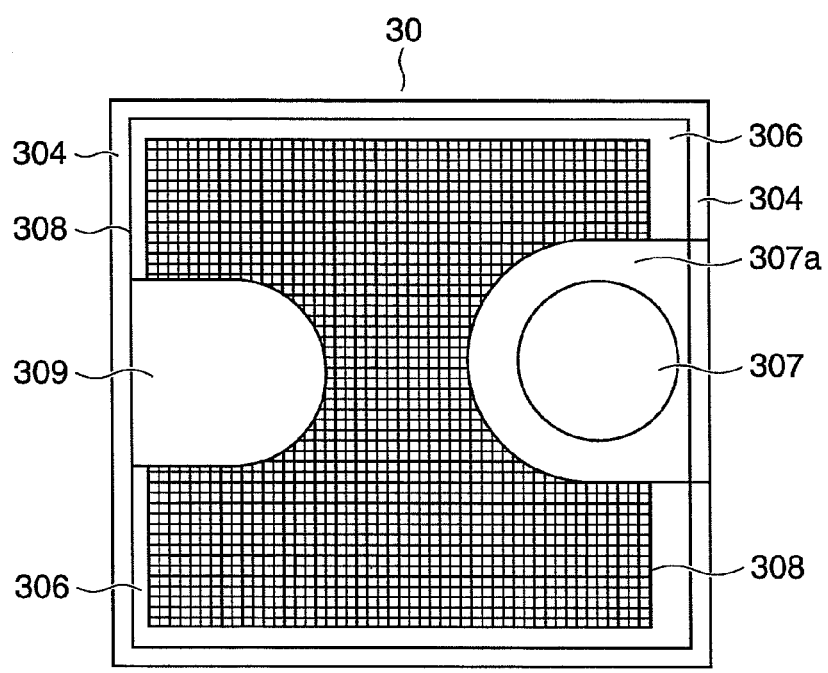
FIG. 9 is a schematic plan view of an LED according to the third embodiment.

FIG. 9 is a plan sectional view of a light-emitting device (LED) 30 produced using the stacked structure of FIG. 7. In the above-mentioned stacked structure, the p-type GaN layer 306 and the light-emitting layer 305 having the multiple quantum well structure included in a region 307a in which the n-type ohmic electrode 307 will be formed were removed by a typical dry etching method, whereby the surface of the n-type AlGaN mixed crystal layer 303 provided under the light-emitting layer 305 was exposed. Thereafter, as shown in FIG. 9, the n-type ohmic electrode 307 is formed on the exposed surface of the n-type AlGaN mixed crystal layer 303 in the region 307a. Meanwhile, a flat lattice shaped p-type ohmic electrode 308 patterned by utilizing a general photolithographic technique was formed on the surface of the p-type GaN layer 306. The p-type ohmic electrode 308 arranged in a lattice form and having a width of 4 μm was constituted of a metal selected from the platinum (Pt) group making an ohmic contact with the p-type GaN layer 306. A pad electrode 309 for bonding is provided at one end of the surface of the p-type GaN layer 306 so as to be electrically connected to the lattice shaped p-type ohmic electrode 308, whereby the light-emitting device (LED) 30 was produced.

When the forward current of the light-emitting device (LED) is 20 mA, the forward voltage (Vf) is 3.4 V. When a current of 20 mA is passed in a forward direction, an LED chip having a square shape with a side length of 350 μm emitted light of white color as a visible color.

INDUSTRIAL APPLICABILITY

In a Group III nitride semiconductor light-emitting device according to the present invention, a light-emitting layer has a multiple quantum well structure comprising barrier layers and well layers. According to this constitution, a white light-emitting device can be easily formed with a simple structure, and since the installation area is substantially the same as the plane area of the light-emitting layer, the luminous intensity can be enhanced, whereby the Group III nitride semiconductor light-emitting device with a high industrial applicability can be provided.

What is claimed is:

1. A Group III nitride semiconductor light-emitting device comprising:
a substrate; and
a light-emitting layer having the multiple quantum well structure that comprises barrier layers and well layers formed of a gallium-containing Group III nitride semiconductor material provided on the substrate,
wherein each of the well layers constituting the multiple quantum well structure is made of a Group III nitride semiconductor layer having the same conductivity type as that of the barrier layer, acceptor impurities are added to the well layers, the well layers have thicknesses different from one another and the well layers independently and simultaneously emit light with a plurality of different wavelengths.

2. The Group III nitride semiconductor light-emitting device according to claim 1, wherein the thickness of each of the well layers constituting the multiple quantum well structure is sequentially reduced from a surface side of the substrate toward a direction of taking out light emission from the light-emitting layer.

3. The Group III nitride semiconductor light-emitting device according to claim 1, wherein the well layers constituting the multiple quantum well structure are different from one another in atomic concentration of the acceptor impurities.

4. The Group III nitride semiconductor light-emitting device according to claim 1, wherein the substrate is formed of a silicon single crystal, magnesium as the acceptor impurities is intentionally added to each of the well layers constituting the multiple quantum well structure.

* * * * *